(12) United States Patent
Kutsunai

(10) Patent No.: US 6,781,177 B2
(45) Date of Patent: Aug. 24, 2004

(54) SEMICONDUCTOR DEVICE AND METHOD FOR FABRICATING THE SAME

(75) Inventor: Toshie Kutsunai, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/455,410

(22) Filed: Jun. 6, 2003

(65) Prior Publication Data

US 2003/0227043 A1 Dec. 11, 2003

(30) Foreign Application Priority Data

Jun. 10, 2002 (JP) ......................................... 2002-168455

(51) Int. Cl.[7] ............................................. H01L 31/062
(52) U.S. Cl. ............................... 257/295; 257/E27.104
(58) Field of Search ........................... 257/295, E27.104

(56) References Cited

U.S. PATENT DOCUMENTS 6,611,014 B1 * 8/2003 Kanaya et al. ............... 257/295

FOREIGN PATENT DOCUMENTS

JP    11-8355 A    1/1999

* cited by examiner

Primary Examiner—David Nelms
Assistant Examiner—Tu-Tu Ho
(74) Attorney, Agent, or Firm—McDermott Will & Emery LLP

(57) ABSTRACT

An interlayer insulating film is formed on a semiconductor substrate on which a transistor has been formed, and an adhesion layer made from a metal oxide not oriented is formed on the interlayer insulating film. A capacitor composed of a lower electrode, a capacitor dielectric film made from a high dielectric constant material or a ferroelectric material and an upper electrode successively formed in this order above the semiconductor substrate is provided on the adhesion layer. A conducting plug for electrically connecting the transistor and the capacitor to each other is provided in the interlayer insulating film and the adhesion layer.

20 Claims, 13 Drawing Sheets

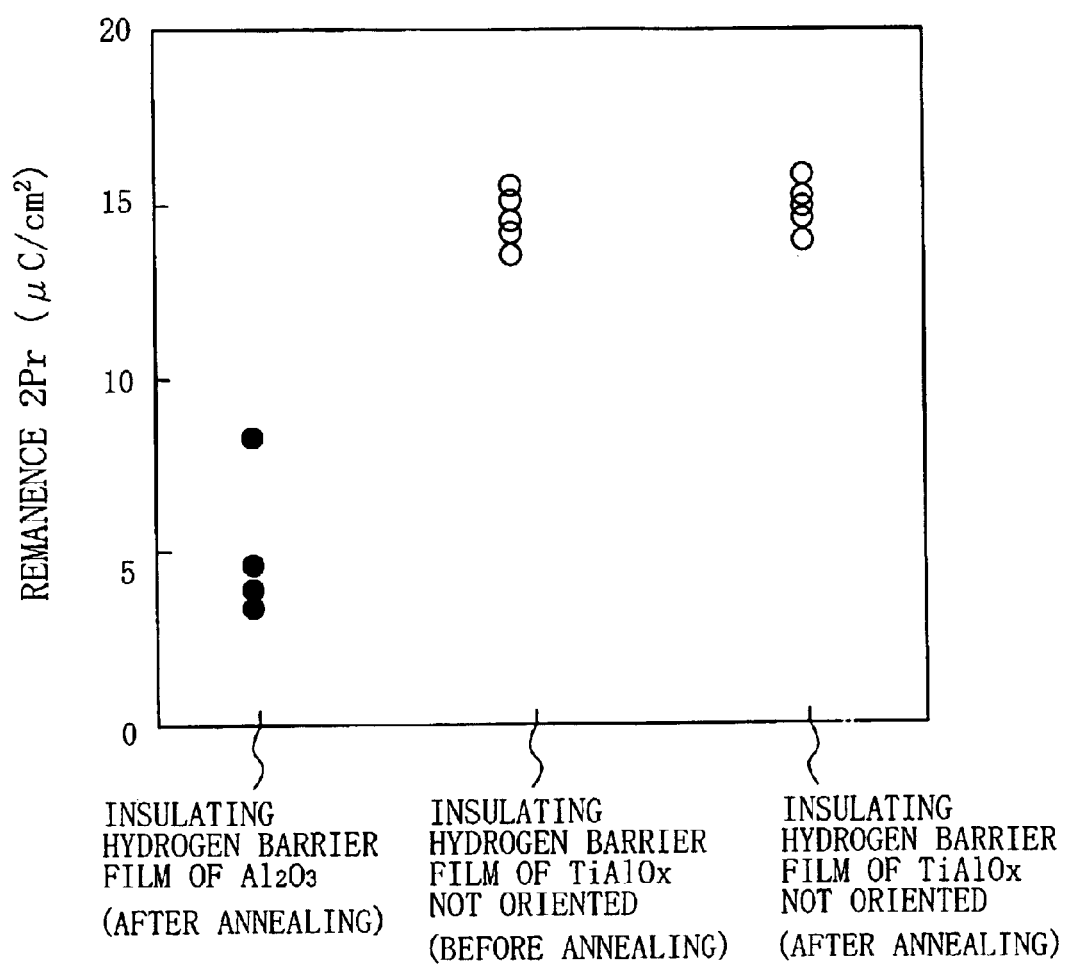

SEMICONDUCTOR DEVICE AND METHOD FOR FABRICATING THE SAME

BACKGROUND OF THE INVENTION

The present invention relates to a semiconductor device equipped with a capacitor including a capacitor dielectric film made from a ferroelectric material or a high dielectric constant material and a method for fabricating the semiconductor device.

In accordance with recent development of digital technology, trend toward processing and storing massive data has been accelerated and electric equipment has attained higher performance. Therefore, semiconductor integrated circuit devices used in electronic equipment and semiconductor devices included in the semiconductor integrated circuit devices have rapidly been refined.

Accordingly, in order to increase the degree of integration of a semiconductor memory (a dynamic RAM), a technique to use a high dielectric constant film as a capacitor dielectric film instead of a conventional silicon oxide or silicon nitride film is now being widely studied and developed.

Also, in order to practically realize a nonvolatile RAM capable of more rapid write and read operations and a lower voltage operation than a conventional device, a technique to use, as a capacitor dielectric film, a ferroelectric film having a spontaneous polarization property is being earnestly studied.

In general, as materials for such a high dielectric constant film or a ferroelectric film, compounds having a bismuth-layer perovskite structure, such as barium strontium titanate, tantalum pentaoxide, lead zirconate titanate and bismuth strontium tantalum, are widely used.

Also, as a method for depositing a high dielectric constant film or a ferroelectric film, various methods including MOCVD (Metal Organic Chemical Vapor Deposition) are known. In any of these known methods, it is necessary to perform annealing in an oxygen atmosphere at a high temperature of approximately 600° C. through 800° C. after depositing a high dielectric constant film or a ferroelectric film, so as to crystallize the high dielectric constant film or the ferroelectric film.

On the other hand, as the memory cell structure of a DRAM or a nonvolatile RAM equipped with a capacitor including a high dielectric constant film or a ferroelectric film, a stacked memory cell structure has been proposed to meet the needs of a higher degree of integration of a semiconductor device. In the stacked memory cell structure, a transistor included in a memory cell is connected to a capacitor disposed above the transistor through a conducting contact plug. When the stacked memory cell structure is employed, the area of a memory cell can be reduced while keeping a large capacity necessary for storage, and hence, it is an indispensable structure for attaining a high degree of integration of a semiconductor device.

Now, a conventional semiconductor device having the stacked memory cell structure will be described with reference to FIG. 12.

As shown in FIG. 12, in the conventional semiconductor device, an isolation region 11 and a pair of impurity diffusion layers 12 working as source and drain regions are formed in surface portions of a semiconductor substrate 10. On the semiconductor substrate 10 between the pair of impurity diffusion layers 12, a gate electrode 14 is formed with a gate insulating film 13 sandwiched between the gate electrode 14 and the semiconductor substrate 10, and a sidewall 15 is formed on both sides of the gate insulating film 13 and the gate electrode 14. The pair of impurity diffusion layers 12, the gate insulating film 13 and the gate electrode 14 together form a transistor.

An interlayer insulating film 16 is formed so as to cover the transistor above the semiconductor substrate 10. On the interlayer insulating film 16, a first conducting barrier layer 18 having a function as an adhesion layer, a second conducting barrier layer 19 and a lower electrode 20 are successively formed, and an insulating film 21 of a silicon oxide film or a silicon nitride film is provided around the first conducting barrier layer 18, the second conducting barrier layer 19 and the lower electrode 20. On the lower electrode 20 and the insulating film 21, a capacitor dielectric film 22 and an upper electrode 23 are successively formed, and the lower electrode 20, the capacitor dielectric film 22 and the upper electrode 23 together form a capacitor.

A hydrogen barrier layer 24 having an insulating property is formed on the upper electrode 23 of the capacitor, and the first conducting barrier layer 18 and one of the pair of impurity diffusion layers 12 are electrically connected to each other through a conducting plug 25 formed in the interlayer insulating film 16.

The first conducting barrier layer 18 is formed in order to prevent a material for the conducting plug 25 from diffusing into the capacitor and thus lowering the adhesion in annealing performed in an oxygen atmosphere for crystallizing the capacitor dielectric film 22, and is made from a nitride material having a conducting property such as titanium nitride, tantalum nitride, titanium aluminum nitride or tantalum aluminum nitride.

The second conducting barrier layer 19 is formed in order to prevent contact resistance from increasing through oxidation of the first conducting barrier layer 18 or the conducting plug 25 by preventing oxygen from diffusing from above into the first conducting barrier layer 18 or the conducting plug 25, and is made from a single film of any of or a multilayer film including iridium, iridium oxide, ruthenium and ruthenium oxide.

The interlayer insulating film 16 is made of a silicon oxide film including boron or phosphorus (hereinafter referred to as a BPSG film).

The aforementioned conventional semiconductor device has, however, the following two disadvantages:

In the conventional semiconductor device, the first conducting barrier layer 18 having a function as an adhesion layer is provided between the interlayer insulting film 16 and the second conducting barrier layer 19. Therefore, adhesion between the first conducting barrier layer 18 and the second conducting barrier layer 19 can be secured, but adhesion between the first conducting barrier layer 18 and the interlayer insulating film 16 cannot be disadvantageously secured. Specifically, during the annealing performed at a high temperature in an oxygen atmosphere for crystallizing the capacitor dielectric film 22, the interlayer insulating film 16 and the first conducting barrier layer 18 can be easily peeled off from each other, and therefore, adhesion between the interlayer insulating film 16 and the capacitor cannot be secured. The reason will now be described with reference to FIGS. 13A and 13B.

As shown in FIG. 13A, the side face of the first conducting barrier layer 18 is not covered with the second conducting barrier layer 19. Therefore, when the annealing is performed at a temperature of 650° C. through 800° C. for crystallizing the capacitor dielectric film 22, oxygen of the atmosphere diffuses into the first conducting barrier layer 18, and hence, the first conducting barrier layer 18 is oxidized.

Since the first conducting barrier layer 18 has a characteristic to increase in its volume when oxidized, the thickness in a peripheral portion of the first conducting barrier layer 18 is increased as shown in FIG. 13B. Therefore, adhesion between the center portion of the first conducting barrier layer 18 and the conducting plug 25 is lowered, and hence, adhesion between the capacitor and the conducting plug 25 is lowered. As a result, there arises a problem that the contact resistance between the capacitor and the conducting plug 25 is increased.

The second disadvantage is that the hydrogen barrier layer 24 having an insulating property cannot completely block hydrogen. The hydrogen barrier layer 24 is deposited by CVD or sputtering, and any hydrogen barrier layer 24 obtained by any of these methods cannot completely block hydrogen.

When the hydrogen barrier layer 24 is deposited by the CVD, a gas used for the deposition occasionally includes $SiH_4$ or $H_2$, and hence, hydrogen is unavoidably excessively included in the atmosphere for depositing this layer. As a result, the atmosphere is unavoidably a reducing atmosphere. Accordingly, the capacitor dielectric film 22 is exposed to the hydrogen atmosphere, and the hydrogen of the atmosphere reduces the capacitor dielectric film 22. Therefore, oxygen deficiency is caused in the capacitor dielectric film 22, so as to cause degradation in the electric characteristic, such as large lowering of the remanence, of the capacitor dielectric film 22.

Alternatively, when the hydrogen barrier layer 24 is deposited by the sputtering in which hydrogen is not present in the resultant film, the resultant film is made from any of various oxides including $Al_2O_3$. Such a film has a characteristic that it cannot be a complete oxide, and hence, a grain boundary is formed in the film. Therefore, there arises a problem that, during annealing performed in a hydrogen atmosphere for recovering the transistor characteristic, hydrogen of the atmosphere passes through the grain boundary of the hydrogen barrier layer 24 to diffuse into the capacitor dielectric film 22.

SUMMARY OF THE INVENTION

In consideration of the aforementioned conventional problems, a first object of the invention is improving adhesion between a conducting plug formed in an interlayer insulating film and a capacitor formed on the interlayer insulating film, and a second object is, in annealing performed in a hydrogen atmosphere, definitely preventing hydrogen of the atmosphere from diffusing into a capacitor dielectric film.

In order to achieve the first object, the first semiconductor device of this invention includes an interlayer insulating film formed on a semiconductor substrate on which a transistor has been formed; an adhesion layer formed on the interlayer insulating film and made from a metal oxide not oriented; a capacitor composed of a lower electrode, a capacitor dielectric film made from a high dielectric constant material or a ferroelectric material and an upper electrode successively formed in this order on the adhesion layer; and a conducting plug formed in the interlayer insulating film and the adhesion layer for electrically connecting the transistor and the capacitor to each other.

In the first semiconductor device of this invention, since the adhesion layer made from the metal oxide not oriented is provided between the interlayer insulating film and the capacitor, adhesion between the interlayer insulating film and the capacitor is improved so that the contact resistance between the capacitor and the conducting plug can be lowered.

In the first semiconductor device, the adhesion layer is preferably amorphous.

Thus, the adhesion between the interlayer insulating film and the capacitor can be definitely improved.

In the first semiconductor device, the metal oxide of the adhesion layer preferably includes titanium aluminum oxide.

Thus, the adhesion between the interlayer insulating film and the capacitor can be definitely improved.

The first semiconductor device preferably further includes a conducting barrier layer formed between the adhesion layer and the conducting plug, and the lower electrode, and the conducting plug preferably connects the transistor and the conducting barrier layer to each other.

Thus, the adhesion layer suppresses volume increase of the conducting barrier layer, and hence, the interlayer insulating film and the conducting barrier layer are minimally peeled off from each other, so that the adhesion between the interlayer insulating film and the capacitor can be definitely improved.

In order to achieve the second object, the second semiconductor device of this invention includes an interlayer insulating film formed on a semiconductor substrate on which a transistor has been formed; a capacitor composed of a lower electrode, a capacitor dielectric film made from a high dielectric constant material or a ferroelectric material and an upper electrode successively formed in this order on the interlayer insulating film; a conducting plug formed in the interlayer insulating film for electrically connecting the transistor and the capacitor to each other; and an insulating upper barrier layer formed over the capacitor and made from a metal oxide not oriented.

In the second semiconductor device of this invention, when annealing is performed in a hydrogen atmosphere for recovering the transistor characteristic, hydrogen of the atmosphere minimally passes through the upper barrier layer. Therefore, the capacitor insulating film can be prevented from being degraded in its characteristic due to reduction with the hydrogen.

In the second semiconductor device, the upper barrier layer is preferably amorphous.

Thus, the hydrogen of the atmosphere can be definitely prevented from passing through the upper barrier layer.

In the second semiconductor device, the metal oxide of the upper barrier layer preferably includes titanium aluminum oxide.

Thus, the hydrogen of the atmosphere can be definitely prevented from passing through the upper barrier layer.

The second semiconductor device preferably further includes an insulating lower barrier layer formed between the interlayer insulating film and the lower electrode and made from a metal oxide not oriented.

Thus, when annealing is carried out in a hydrogen atmosphere for recovering the transistor characteristic, hydrogen of the atmosphere minimally passes through the lower barrier layer, and hence, the hydrogen can be prevented from diffusing into the interlayer insulating film and reaching the capacitor. Therefore, the capacitor dielectric film can be prevented from being degraded in its characteristic due to reduction with the hydrogen.

In the case where the second semiconductor device includes the lower barrier layer, the lower barrier layer is preferably amorphous.

Thus, the hydrogen of the atmosphere can be definitely prevented from passing through the lower barrier layer.

In the case where the second semiconductor device includes the lower barrier layer, the metal oxide of the lower barrier layer preferably includes titanium aluminum oxide.

Thus, the hydrogen of the atmosphere can be definitely prevented from passing through the lower barrier layer.

In the case where the second semiconductor device includes the lower barrier layer, the second semiconductor device preferably further includes a conducting barrier layer formed between the lower barrier layer and the conducting plug, and the lower electrode, and the conducting plug preferably connects the transistor and the conducting barrier layer to each other.

Thus, the lower barrier layer suppresses volume increase in the thickness direction of the conducting barrier layer, and hence, the interlayer insulating film and the conducting barrier layer are minimally peeled off from each other, so that the adhesion between the interlayer insulating film and the capacitor can be improved.

In the case where the second semiconductor device includes the lower barrier layer and the conducting barrier layer, the second semiconductor device preferably further includes an insulating side barrier layer formed over a side face of the conducting barrier layer and made from a metal oxide not oriented.

Thus, the side barrier layer suppresses the volume increase in the thickness direction of the conducting barrier layer, and hence, the interlayer insulating film and the conducting barrier layer are minimally peeled off from each other, so that the adhesion between the interlayer insulating film and the capacitor can be definitely improved.

In order to achieve the first object, the first method for fabricating a semiconductor device of this invention includes the steps of forming an interlayer insulating film on a semiconductor substrate on which a transistor has been formed; forming an adhesion layer on the interlayer insulating film from a metal oxide not oriented; forming, in the interlayer insulating film and the adhesion layer, a conducting plug having one end connected to the transistor; forming, on the adhesion layer, a capacitor electrically connected to the other end of the conducting plug and composed of a lower electrode, a capacitor dielectric film made from a high dielectric constant material or a ferroelectric material and an upper electrode successively disposed in this order on the adhesion layer; and performing annealing in an oxygen atmosphere for crystallizing the capacitor dielectric film.

In the first method for fabricating a semiconductor device of this invention, since the adhesion layer made from the metal oxide not oriented is formed between the interlayer insulating film and the capacitor, adhesion between the interlayer insulating film and the capacitor is improved, so that the contact resistance between the capacitor and the conducting plug can be lowered.

In the first method for fabricating a semiconductor device, the adhesion layer is preferably formed by sputtering carried out at a chamber pressure of 0.6 Pa or more and DC power of 12 kW or less.

Thus, the adhesion layer made from the metal oxide not oriented can be definitely formed between the interlayer insulating film and the capacitor.

In order to achieve the second object, the second method for fabricating a semiconductor device of this invention includes the steps of forming an interlayer insulating film on a semiconductor substrate on which a transistor has been formed; forming, in the interlayer insulating film, a conducting plug having one end connected to the transistor; forming, on the interlayer insulating film, a capacitor electrically connected to the other end of the conducting plug and composed of a lower electrode, a capacitor dielectric film made from a high dielectric constant material or a ferroelectric material and an upper electrode successively disposed in this order on the interlayer insulating film; forming an insulating upper barrier layer over the capacitor from a metal oxide not oriented; and performing annealing in a hydrogen atmosphere.

In the second method for fabricating a semiconductor device, when the annealing is performed in a hydrogen atmosphere for recovering the transistor characteristic, hydrogen of the atmosphere minimally passes through the upper barrier layer, so that the capacitor dielectric film can be prevented from being degraded in its characteristic due to reduction with the hydrogen.

In the second method for fabricating a semiconductor device, the upper barrier layer is preferably formed by sputtering carried out at a chamber pressure of 0.6 Pa or more and DC power of 12 kW or less.

Thus, the upper barrier layer made from the metal oxide not oriented can be definitely formed.

The second method for fabricating a semiconductor device of this invention preferably further includes, between the step of forming an interlayer insulating film and the step of forming a conducting plug, a step of forming an insulating lower barrier layer over a bottom face of the capacitor from a metal oxide not oriented, and the conducting plug is formed in the interlayer insulating film and the lower barrier layer in the step of forming a conducting plug.

Thus, when the annealing is carried out in a hydrogen atmosphere for recovering the transistor characteristic, the hydrogen of the atmosphere minimally passes through the lower barrier layer, and hence, the hydrogen can be prevented from diffusing into the interlayer insulating film and reaching the capacitor. Therefore, the capacitor dielectric film can be prevented from being degraded in its characteristic due to reduction with the hydrogen.

In the case where the second method for fabricating a semiconductor device includes the step of forming a lower barrier layer, the lower barrier layer is preferably formed by sputtering carried out at a chamber pressure of 0.6 Pa or more and DC power of 12 kW or less.

Thus, the lower barrier layer made from the metal oxide not oriented can be definitely formed.

In the case where the second method for fabricating a semiconductor device includes the step of forming a lower barrier layer, the second method preferably further includes, between the step of forming a conducting plug and the step of forming a capacitor, a step of forming a conducting barrier layer on the lower barrier layer and the conducting plug.

Thus, the lower barrier layer suppresses the volume increase in the thickness direction of the conducting barrier layer, and hence, the interlayer insulating film and the conducting barrier layer are minimally peeled off from each other, so that the adhesion between the interlayer insulating film and the capacitor can be improved.

In the case where the second method for fabricating a semiconductor device includes the steps of forming a lower barrier layer and a conducting barrier layer, the step of forming a capacitor preferably includes a sub-step of forming an insulating side barrier layer over a side face of the conducting barrier layer from a metal oxide not oriented.

Thus, the side barrier layer suppresses the volume increase in the thickness direction of the conducting barrier layer, and hence, the interlayer insulating film and the conducting barrier layer are minimally peeled off from each other, so that the adhesion between the interlayer insulating film and the capacitor can be definitely improved.

BRIEF DESCRIPTION OF THE DRAWINGS

FIG. 9 is a diagram for showing values of remanence of the conventional hydrogen barrier layer and the hydrogen barrier layer of Embodiment 2;

DETAILED DESCRIPTION OF THE INVENTION

Embodiment 1

Now, a semiconductor device and a method for fabricating the same according to Embodiment 1 will be described.

Figure 1:
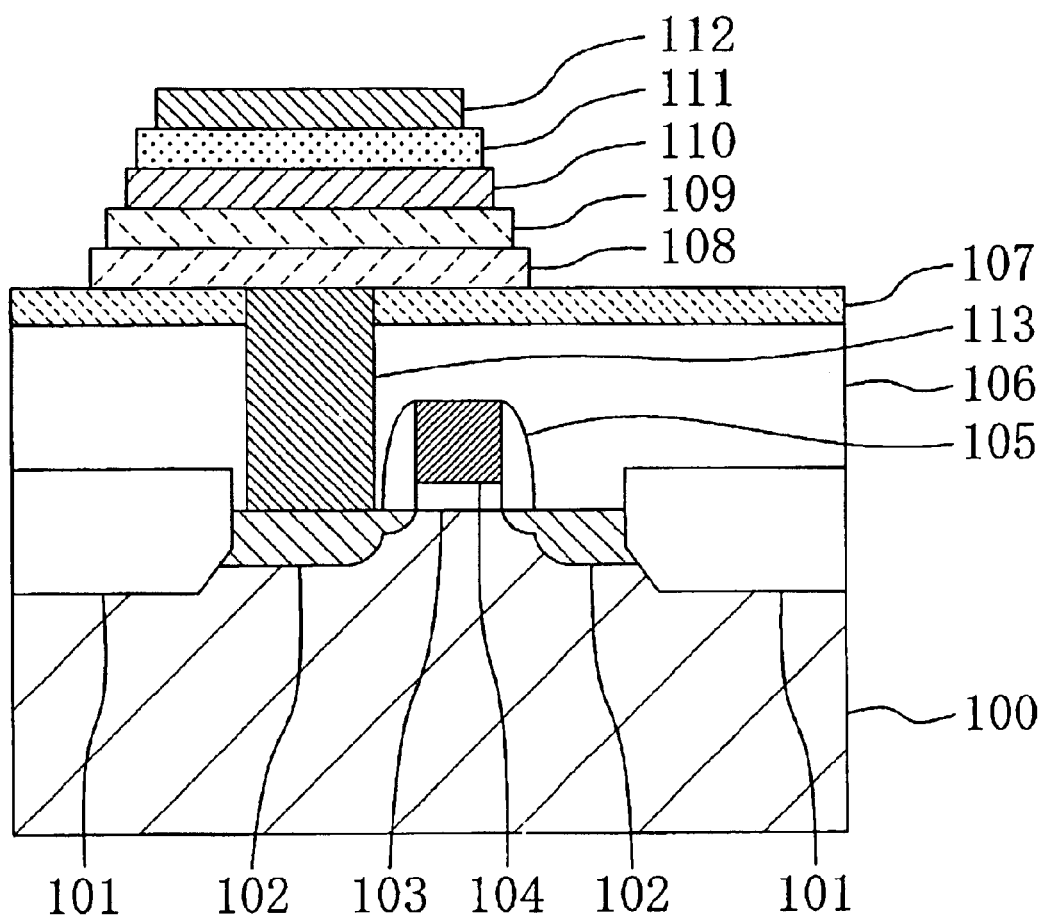
FIG. 1 is a cross-sectional view of a semiconductor device according to Embodiment 1 of the invention.

FIG. 1 shows the cross-sectional structure of a principal part of a semiconductor device of Embodiment 1. As shown in FIG. 1, an isolation region 101 and a pair of impurity diffusion layers 102 working as source and drain regions are formed in surface portions of a semiconductor substrate 100. Between the pair of impurity diffusion layers 102 on the semiconductor substrate 100, a gate electrode 104 is formed with a gate insulating film 103 sandwiched between the gate electrode 104 and the semiconductor substrate 100, and a sidewall 105 is formed on both sides of the gate insulating film 103 and the gate electrode 104. The pair of impurity diffusion layers 102, the gate insulating film 103 and the gate electrode 104 together form a transistor.

An interlayer insulating film 106 of BPSG is formed so as to cover the transistor above the semiconductor substrate 100, and an adhesion layer 107 with a thickness of 5 through 60 nm made from a metal oxide not oriented, such as titanium aluminum oxide, is formed on the interlayer insulating film 106.

A first conducting barrier layer 108 of, for example, titanium aluminum nitride and a second conducting barrier layer 109 made from a multilayer film of, for example, iridium and iridium oxide are formed on the adhesion layer 107.

A lower electrode 110 of, for example, platinum, a capacitor dielectric film 111 of, for example, $Sr_2Bi_2(Ta_{2-x}Nb_x)O_9$ (wherein 2>x>0), and an upper electrode 112 of, for example, platinum are successively formed on the second conducting barrier layer 109. The lower electrode 110, the capacitor dielectric film 111 and the upper electrode 112 together form a capacitor.

A conducting plug 113 of, for example, tungsten is buried in the interlayer insulating film 106 and the adhesion layer 107, so that the first conducting barrier layer 108 and one of the pair of impurity diffusion layers 102 can be electrically connected to each other through the conducting plug 113.

Now, a method for fabricating the semiconductor device of Embodiment 1 will be described with reference to FIGS. 2A, 2B, 3A and 3B.

Figure 2A:
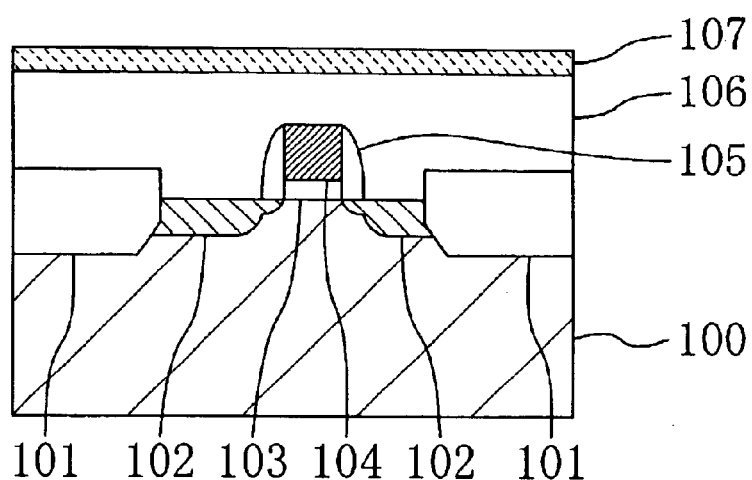
FIGS. 2A and 2B are cross-sectional views for showing procedures in a method for fabricating a semiconductor device of Embodiment 1.

First, as shown in FIG. 2A, an isolation region 101 is formed in a surface portion of a semiconductor substrate 100. Next, a gate electrode 104 is formed with a gate insulating film 103 sandwiched between the gate electrode 104 and the semiconductor substrate 100, and a sidewall 105 is formed on the side faces of the gate insulating film 103 and the gate electrode 104. Thereafter, a pair of impurity diffusion layers 102 working as source and drain regions are formed in surface portions of the semiconductor substrate 100. Thus, a transistor composed of the pair of impurity diffusion layers 102, the gate insulating film 103 and the gate electrode 104 is formed.

Then, an interlayer insulating film 106 of BPSG is formed so as to cover the transistor above the semiconductor substrate 100. Thereafter, an adhesion layer 107 with a thickness of 5 through 60 nm made from a metal oxide not oriented, such as titanium aluminum oxide, is formed on the interlayer insulating film 106 by sputtering.

Figure 2B:
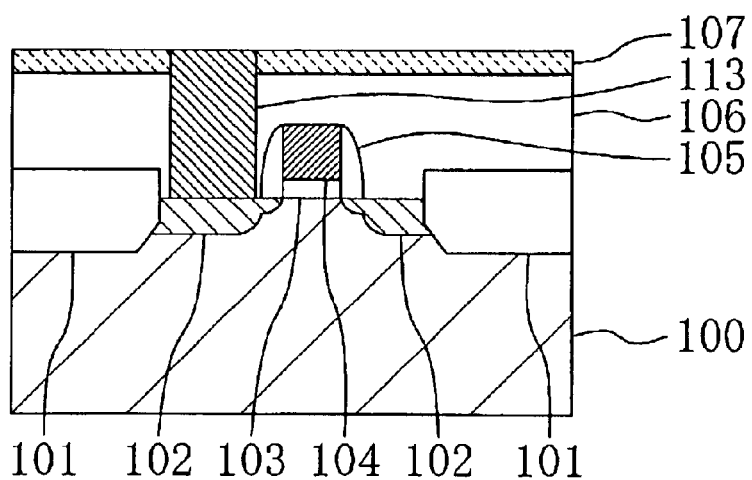

Next, as shown in FIG. 2B, an opening reaching one of the impurity diffusion layers 102 is formed in predetermined portions of the adhesion layer 107 and the interlayer insulating film 106 by RIE (Reactive Ion Etching) or the like, and the opening is then filled with a tungsten film by CVD. Thereafter, a portion of the tungsten film exposed above the adhesion layer 107 is removed by CMP, so as to form a conducting plug 113 of tungsten.

Figure 3A:
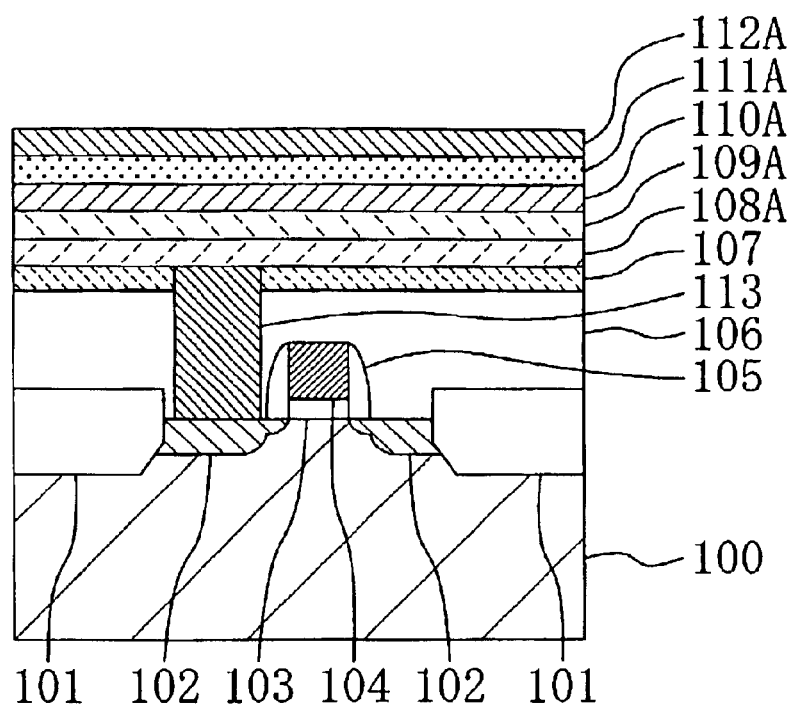
FIGS. 3A and 3B are cross-sectional views for showing other procedures in the method for fabricating a semiconductor device of Embodiment 1.
Figure 3B:
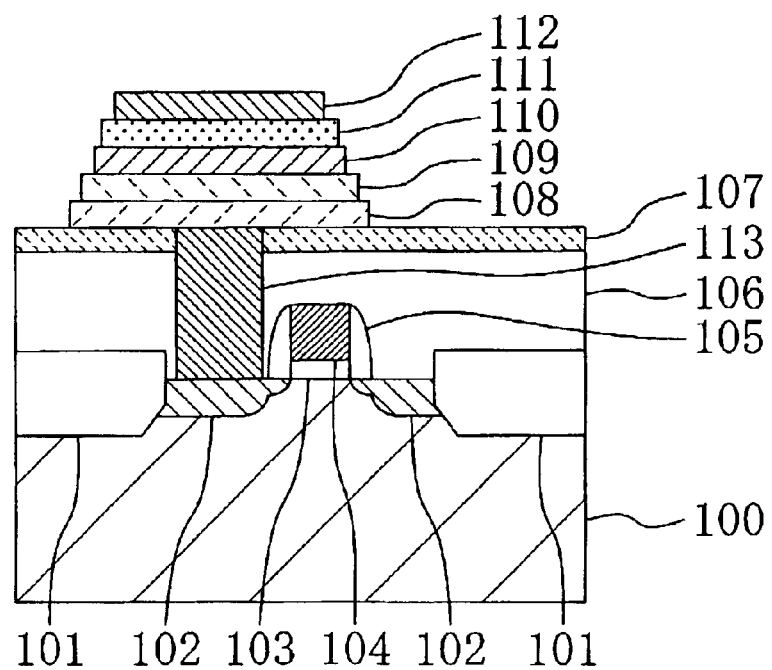

Subsequently, as shown in FIG. 3A, a first conducting film 108A of titanium aluminum nitride with a thickness of 40 through 60 nm, a second conducting film 109A made from a multilayer film including an iridium film with a thickness of 50 through 100 nm and an iridium oxide film with a thickness of 50 through 100 nm, a first metal film 110A of platinum with a thickness of 50 through 100 nm, a metal oxide dielectric film 111A of $Sr_2Bi_2(Ta_{2-x}Nb_x)O_9$ (wherein 2>x>0) with a thickness of 50 through 100 nm, and a second metal film 112A of platinum with a thickness of 50 through 100 nm are successively deposited on the adhesion layer 107 and the conducting plug 113 by the CVD or sputtering.

Next, the second metal film 112A, the metal oxide dielectric film 111A, the first metal film 110A, the second conducting film 109A and the first conducting film 108A are successively patterned by the RIE or the like, so as to form an upper electrode 112 from the second metal film 112A, a capacitor dielectric film 111 from the metal oxide dielectric film 111A, a lower electrode 110 from the first metal film 110A, a second conducting barrier layer 109 from the second conducting film 109A, and a first conducting barrier layer 108 from the first conducting film 108A.

Then, annealing is carried out in an oxygen atmosphere at a temperature of 650° C. through 800° C. for crystallizing the capacitor dielectric film 111. Thus, a capacitor composed of the lower electrode 110, the capacitor dielectric film 111 and the upper electrode 112 is formed. Thereafter, annealing is carried out in a hydrogen atmosphere for recovering the transistor characteristic.

The characteristics of and the method for depositing the adhesion layer 107 made from the metal oxide not oriented will be described later.

In the semiconductor device and the method for fabricating the same according to Embodiment 1, the adhesion layer 107 made from the metal oxide not oriented and having stiffness is provided below and in contact with the first conducting barrier layer 108. Therefore, in the annealing carried out in an oxygen atmosphere for crystallizing the capacitor dielectric film 111, even when the first conducting barrier layer 108 is oxidized, the adhesion layer 107 suppresses volume increase of the first conducting barrier layer 108. Therefore, the first conducting barrier layer 108 and the interlayer insulating film 106 are minimally peeled off from each other, and hence, the contact resistance between the capacitor and the conducting plug 113 can be prevented from increasing and the mechanical strength and the reliability of the capacitor can be improved.

In Embodiment 1, tantalum aluminum oxide may be used as the metal oxide instead of titanium aluminum oxide. Also, the adhesion layer 107 made from the metal oxide not oriented is preferably amorphous.

Figure 12:
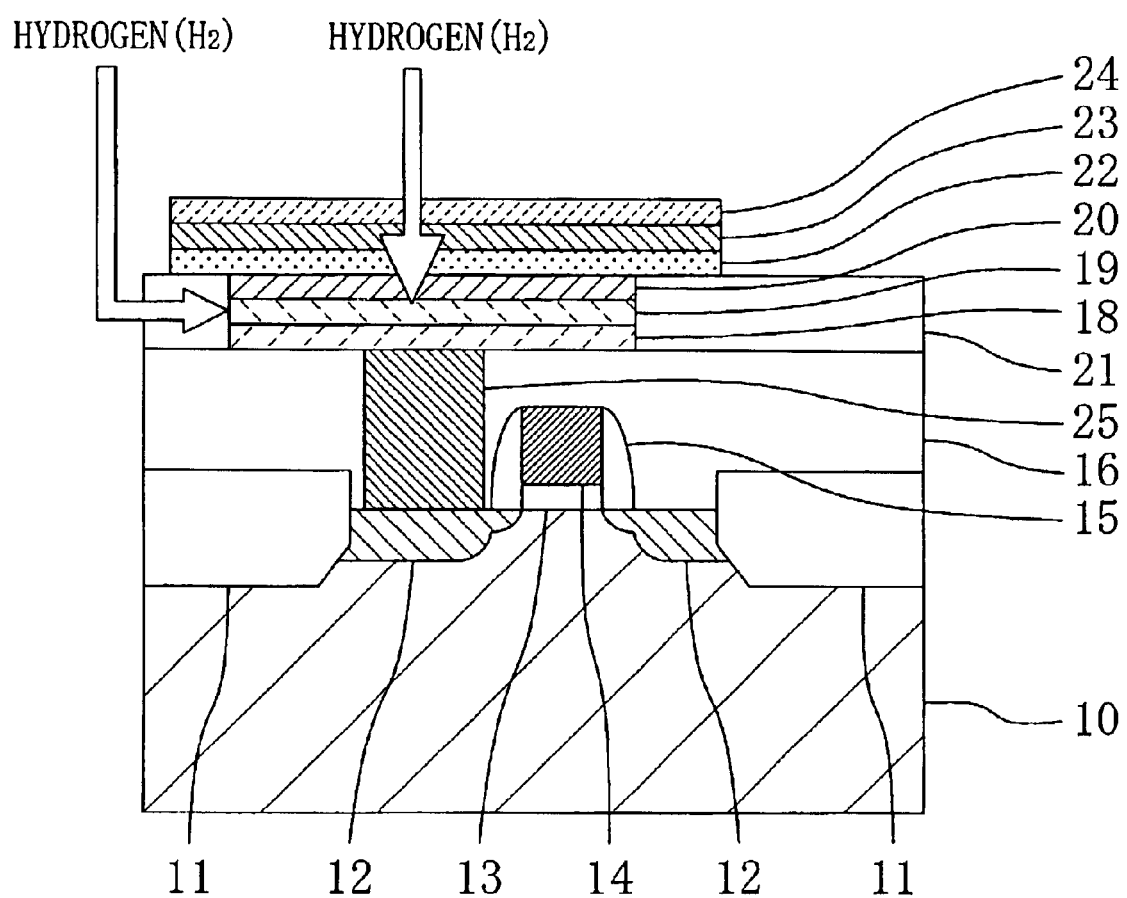
FIG. 12 is a cross-sectional view of a conventional semiconductor device.
Figure 13A:
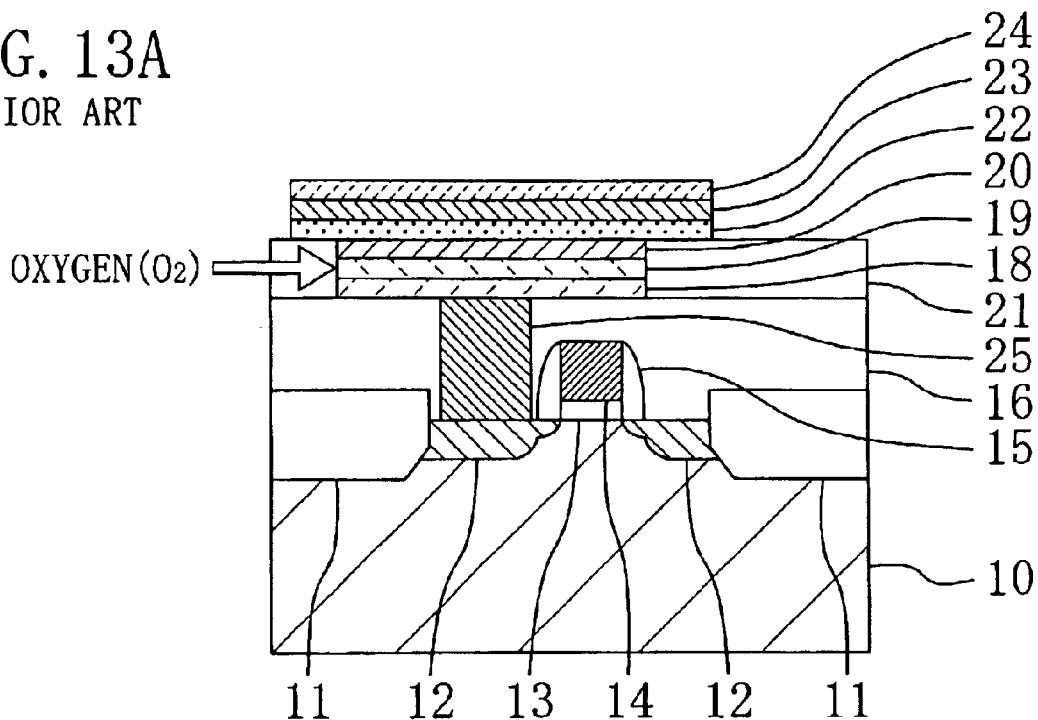
FIGS. 13A and 13B are cross-sectional views for explaining a problem of the conventional semiconductor device.
Figure 13B:
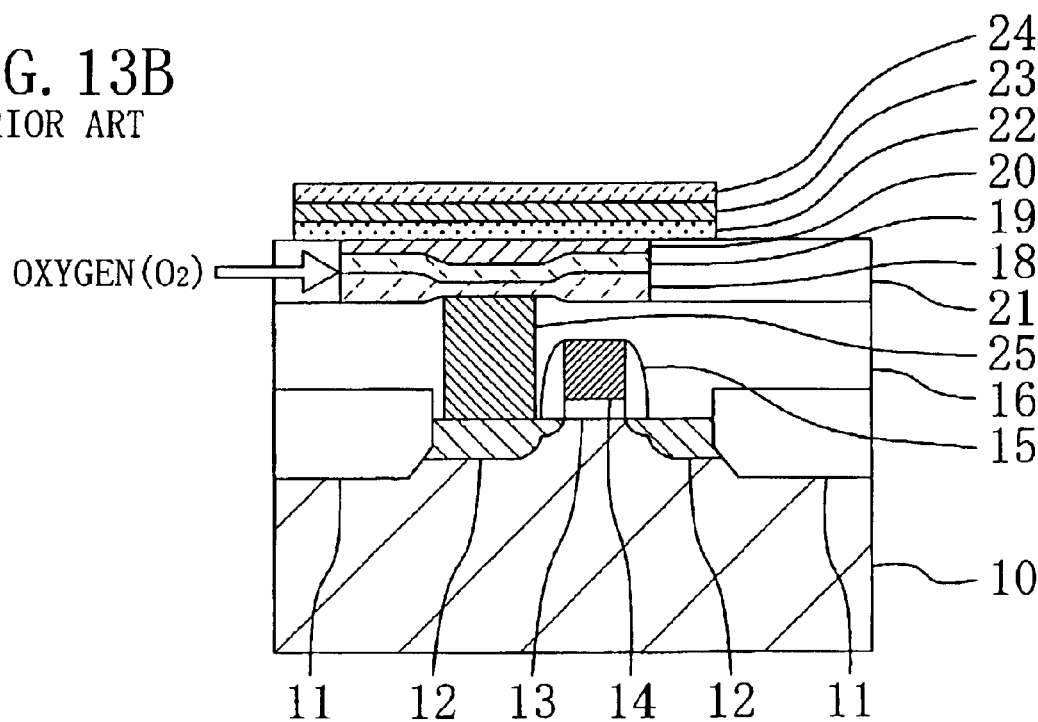

Now, results of an experiment performed for evaluating the semiconductor device and the method for fabricating the same of Embodiment 1 will be described. In the experiment, a conducting plug with a contact size of 0.24 µm is formed in each of the semiconductor device of Embodiment 1 shown in FIG. 1 and a conventional semiconductor device shown in FIG. 12, and the annealing is carried out in an oxygen atmosphere at a temperature of 800° C. for 1 hour.

Figure 4:
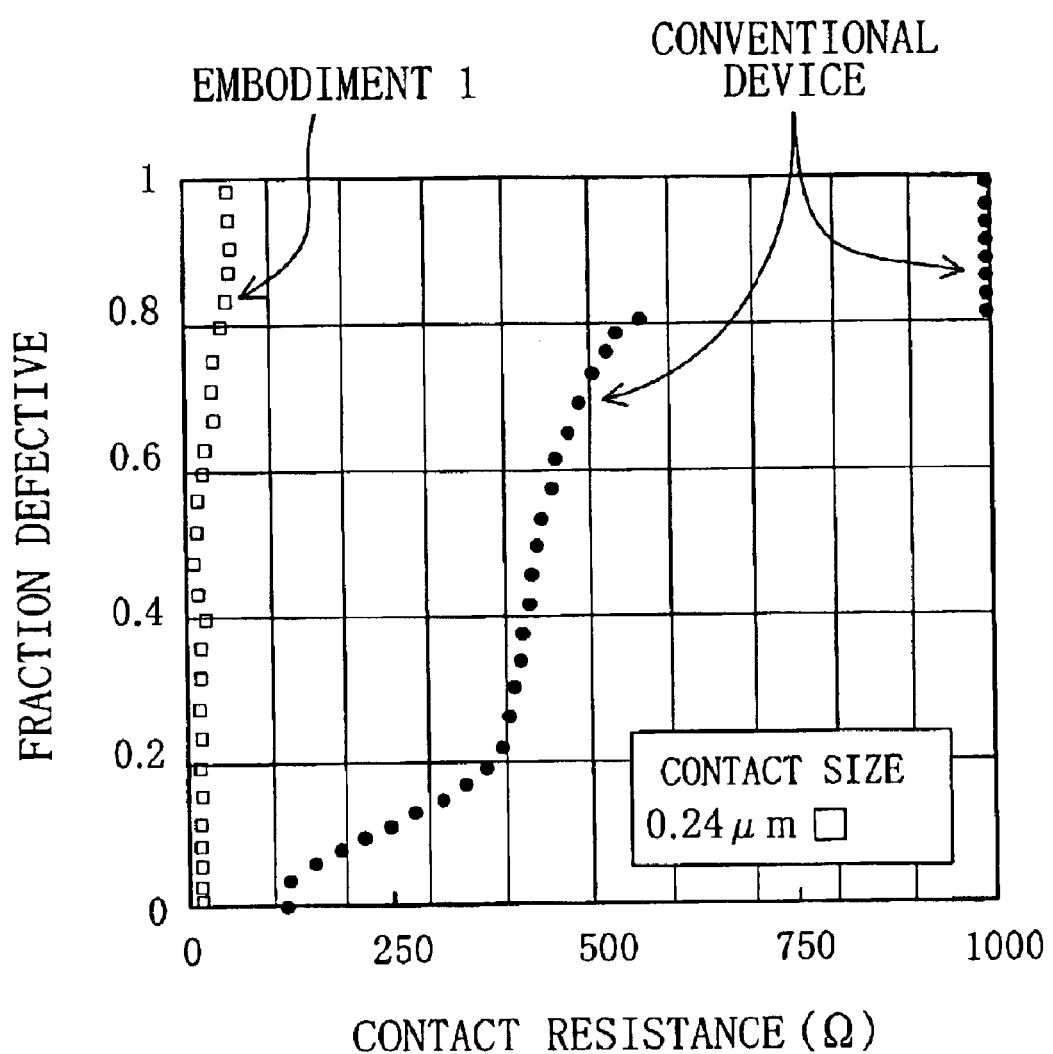
FIG. 4 is a graph for showing fraction defective of a conducting plug in the semiconductor device of Embodiment 1 and a conventional semiconductor device.

FIG. 4 shows fraction defective of the conducting plugs in the semiconductor device of Embodiment 1 and the conventional semiconductor device.

As is understood from FIG. 4, the fraction defective of the conducting plug 25 is 75% and the contact resistance is 500 Ω on average in the conventional semiconductor device. This is because the first conducting barrier layer 18 and the interlayer insulating film 16 are peeled off from each other since the volume in the thickness direction of the first conducting barrier layer 18 is increased through oxidation, and as a result, the contact resistance between the capacitor and the conducting plug 25 is increased.

In contrast, the fraction defective of the conducting plug 113 is 0% and the contact resistance is 40 Ω on average, and variation in the contact resistance can be remarkably reduced in the semiconductor device of Embodiment 1. This is because the first conducting barrier layer 108 and the interlayer insulating film 106 are minimally peeled off from each other since the first conducting barrier layer 108 is minimally increased in its volume even when oxidized, and as a result, the contact resistance between the capacitor and the conducting plug 113 is lowered.

Embodiment 2

Now, a semiconductor device and a method for fabricating the same according to Embodiment 2 of the invention will be described.

Figure 5:
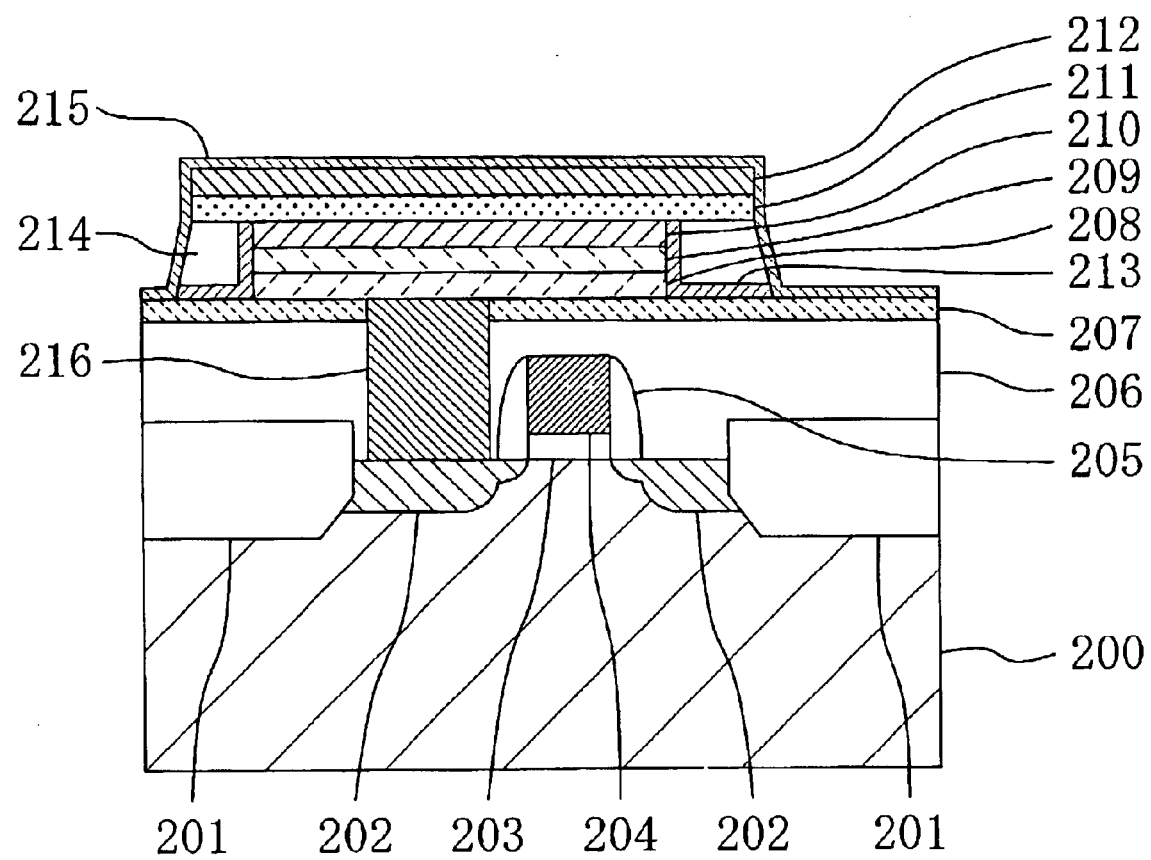
FIG. 5 is a cross-sectional view of a semiconductor device according to Embodiment 2 of the invention.

FIG. 5 shows the cross-sectional structure of a principal part of a semiconductor device of Embodiment 2. As shown in FIG. 5, an isolation region 201 and a pair of impurity diffusion layers 202 working as source and drain regions are formed in surface portions of the semiconductor substrate 200. Between the pair of impurity diffusion layers 202 on the semiconductor substrate 200, a gate electrode 204 is formed with a gate insulating film 203 sandwiched between the gate electrode 204 and the semiconductor substrate 200, and a sidewall 205 is formed on both sides of the gate insulating film 203 and the gate electrode 204. The pair of impurity diffusion layers 202, the gate insulating film 203 and the gate electrode 204 together form a transistor.

An interlayer insulating film 206 of BPSG is formed so as to cover the transistor above the semiconductor substrate 200. An insulating lower barrier layer 207 with a thickness of 5 through 60 nm made from a metal oxide not oriented, such as titanium aluminum oxide, is formed on the interlayer insulating film 206.

A first conducting barrier layer 208 of, for example, titanium aluminum nitride, a second conducting barrier layer 209 made from a multilayer film of, for example, iridium and iridium oxide, and a lower electrode 210 of, for example, platinum are successively formed on the lower barrier layer 207. An insulating side barrier layer 213 made from a metal oxide not oriented, such as titanium aluminum oxide, is formed over the side faces of the first conducting barrier layer 208, the second conducting barrier layer 209 and the lower electrode 210 and the top face of the lower barrier layer 207. An insulating film 214 of, for example, a silicon oxide film is formed outside the side barrier layer 213.

A capacitor dielectric film 211 of, for example, $Sr_2Bi_2(Ta_{2-x}Nb_x)O_9$ (wherein 2>x>0) and an upper electrode 212 of, for example, platinum are successively formed on the lower electrode 210 and the insulating film 214. The lower electrode 210, the capacitor dielectric film 211 and the upper electrode 212 together form a capacitor. An insulating upper barrier layer 215 made from a metal oxide not oriented, such as titanium aluminum oxide, is formed over the top face of the upper electrode 212, the side faces of the upper electrode 212, the capacitor dielectric film 211 and the insulating film 214 and the top face of the lower barrier layer 207. The upper barrier layer 215 may not be formed outside the insulating film 214, namely, on the lower barrier layer 207.

A conducting plug 216 of, for example, tungsten is buried in the interlayer insulating film 206 and the lower barrier layer 207, so that the first conducting barrier layer 208 and one of the pair of impurity diffusion layers 202 can be electrically connected to each other through the conducting plug 216.

Now, a method for fabricating the semiconductor device of Embodiment 2 will be described with reference to FIGS. 6A through 6C, 7A and 7B.

Figure 6A:
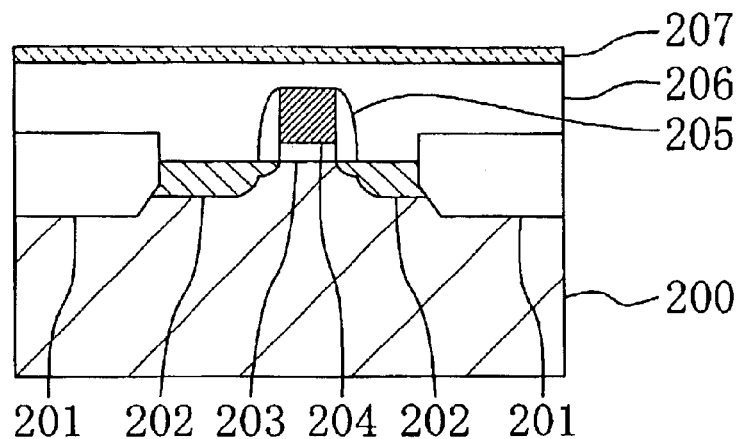
FIGS. 6A, 6B and 6C are cross-sectional views for showing procedures in a method for fabricating a semiconductor device of Embodiment 2.

First, as shown in FIG. 6A, an isolation region 201 is formed in a surface portion of a semiconductor substrate 200. Next, after forming a gate electrode 204 with a gate insulating film 203 sandwiched between the gate electrode 204 and the semiconductor substrate 200, a sidewall 205 is formed on the side faces of the gate insulating film 203 and the gate electrode 204. Thereafter, a pair of impurity diffusion layers 202 working as source and drain regions are formed in surface portions of the semiconductor substrate 200. Thus, a transistor composed of the pair of impurity diffusion layers 202, the gate insulating film 203 and the gate electrode 204 is formed.

Next, after an interlayer insulating film 206 of BPSG is formed so as to cover the transistor above the semiconductor substrate 200, an insulating lower barrier layer 207 with a thickness of 5 nm through 60 nm made from a metal oxide not oriented, such as titanium aluminum oxide, is formed on the interlayer insulating film 206 by the sputtering.

Figure 6B:
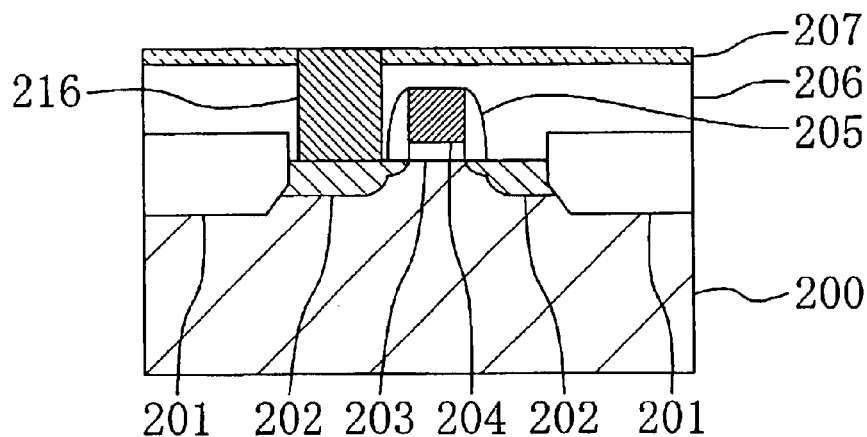

Then, as shown in FIG. 6B, after forming an opening reaching one of the impurity diffusion layers 202 in predetermined portions of the lower barrier layer 207 and the interlayer insulating film 206 by the RIE or the like, a tungsten film is filled in the opening by the CVD. Thereafter, a portion of the tungsten film exposed above the lower barrier layer 207 is removed by the CMP, so as to form a conducting plug 216 of tungsten.

Figure 6C:
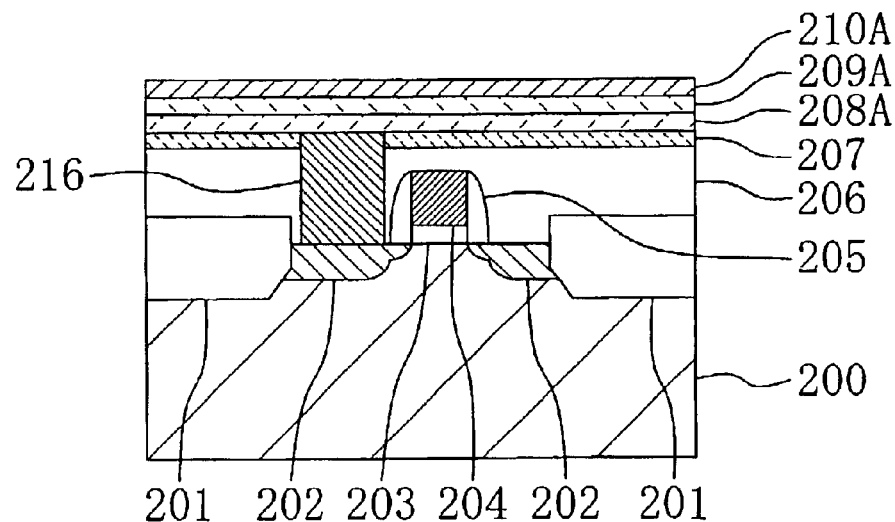

Next, as shown in FIG. 6C, a first conducting film 208A of titanium aluminum nitride with a thickness of 40 nm through 60 nm, a second conducting film 209A made from a multilayer film including an iridium film with a thickness of 50 nm through 100 nm and an iridium oxide film with a thickness of 50 nm through 100 nm, and a first metal film 210A of platinum with a thickness of 50 nm through 100 nm are successively deposited on the lower barrier layer 207 and the conducting plug 216 by the CVD or sputtering.

Figure 7A:
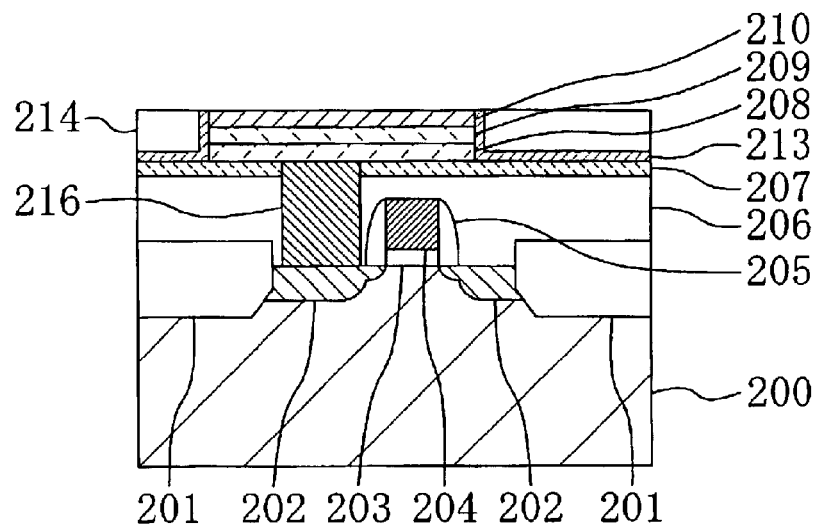
FIGS. 7A and 7B are cross-sectional views for showing other procedures in the method for fabricating a semiconductor device of Embodiment 2.

Subsequently, as shown in FIG. 7A, the first metal film 210A, the second conducting film 209A and the first conducting film 208A are successively patterned by the RIE, so as to form a lower electrode 210 from the first metal film 210A, a second conducting barrier layer 209 from the second conducting film 209A and a first conducting barrier layer 208 from the first conducting film 208A.

Then, an insulating side barrier layer 213 with a thickness of 60 nm through 120 nm made from a metal oxide not oriented, such as titanium aluminum oxide, is deposited over the lower electrode 210 and the lower barrier layer 207 by the sputtering. Thereafter, an insulating film 214 of, for example, a silicon oxide film with a thickness of 300 nm through 500 nm is deposited on the side barrier layer 213 by the CVD. Then, the insulating film 214 and the side barrier layer 213 is subjected to the CMP, so as to expose the top face of the lower electrode 210.

Figure 7B:
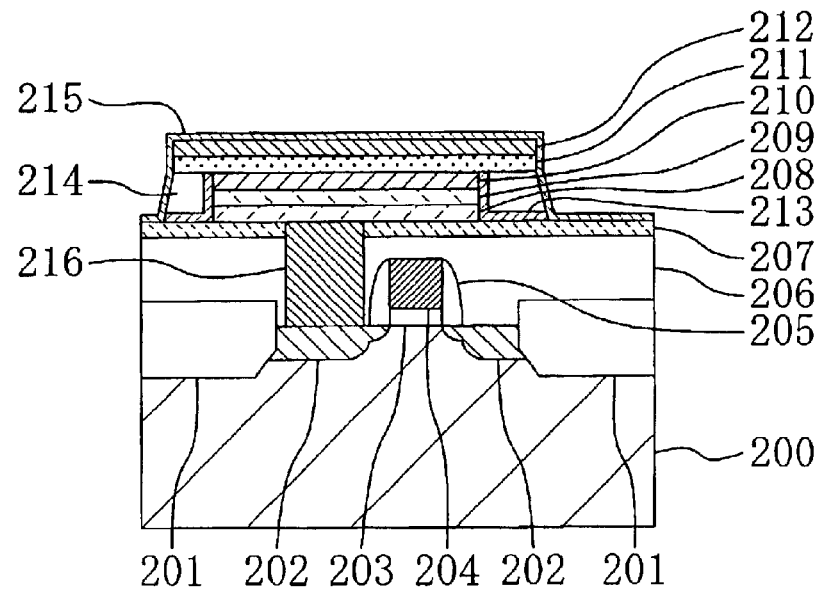

Next, as shown in FIG. 7B, a metal oxide dielectric film of $Sr_2Bi_2(Ta_{2-x}Nb_x)O_9$ (wherein 2>x>0) and a second metal film of platinum are successively deposited on the lower electrode 210 and the insulating film 214, and the metal oxide dielectric film and the second metal film are patterned, so as to form a capacitor dielectric film 211 from the metal oxide dielectric film and an upper electrode 212 from the second metal film. Then, annealing is carried out in an oxygen atmosphere at a temperature of 650° C. through 800° C. for crystallizing the capacitor dielectric film 111. Thus, a capacitor composed of the lower electrode 210, the capacitor dielectric film 211 and the upper electrode 212 is formed.

Subsequently, the side barrier layer 213 and the insulating film 214 are patterned by the RIE, so that the side barrier layer 213 and the insulating film 214 can remain merely in a portion around the capacitor. Then, an insulating upper barrier layer 215 with a thickness of 5 nm through 60 nm made from a metal oxide not oriented, such as titanium aluminum oxide, is deposited by the sputtering on the top face of the upper electrode 212, the side faces of the upper electrode 212, the capacitor dielectric film 211 and the insulating film 214 and the top face of the lower barrier layer 207. Thereafter, annealing is carried out in a hydrogen atmosphere for recovering the transistor characteristic.

The characteristics of and the method for depositing the lower barrier layer 207, the side barrier layer 213 and the upper barrier layer 215 made from the metal oxide not oriented will be described later.

In the semiconductor device and the method for fabricating the same according to Embodiment 2, the lower barrier layer 207 having stiffness is provided below the first conducting barrier layer 208 and the side barrier layer 213 having stiffness is provided on the side face of the first conducting barrier layer 208. Therefore, during the annealing performed in an oxygen atmosphere for crystallizing the capacitor dielectric film 211, even when the first conducting barrier layer 208 is oxidized, the volume increase in the thickness direction of the first conducting barrier layer 208 is suppressed by the lower barrier layer 207 and the side barrier layer 213. Accordingly, the first conducting barrier layer 208 and the interlayer insulating film 206 are minimally peeled off from each other. As a result, the increase of the contact resistance between the capacitor and the conducting plug 216 can be suppressed, and the mechanical strength and the reliability of the capacitor can be improved.

Also, since the lower barrier layer 207 and the upper barrier layer 215, which are made from the metal oxide not oriented, have a good hydrogen blocking property. Therefore, even when the annealing is carried out in a hydrogen atmosphere, hydrogen approaching from below, namely, through the interlayer insulating film 206, is blocked by the lower barrier layer 207, and hydrogen approaching from above or a side is blocked by the upper barrier layer 215. As a result, the characteristic of the capacitor dielectric film 211 can be definitely prevented from being degraded by the hydrogen.

In Embodiment 2, tantalum aluminum oxide may be used as the metal oxide instead of titanium aluminum oxide. Also, the lower barrier layer 207, the side barrier layer 213 and the upper barrier layer 215 made from the metal oxide not oriented are preferably amorphous.

(Characteristics of Film Made from Metal Oxide not Oriented)

Now, the characteristics of a titanium aluminum oxide film not oriented, which is used in each of Embodiments 1 and 2, will be described.

Figure 8A:
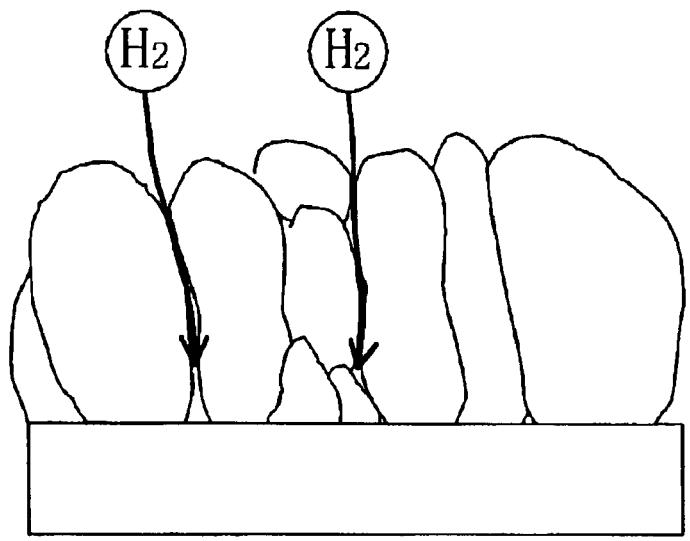
FIG. 8A is a schematic cross-sectional view of a conventional hydrogen barrier layer and FIG. 8B is a schematic cross-sectional view of a hydrogen barrier layer of Embodiment 2.
Figure 8B:
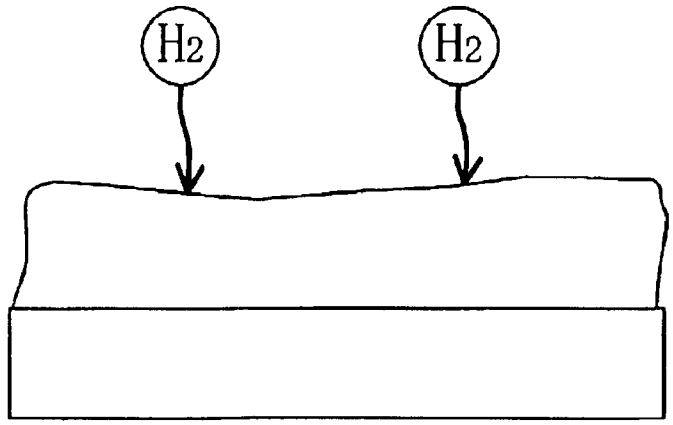

In a conventional device, an $Al_2O_3$ (alumina) film deposited by the CVD or sputtering is used as a hydrogen barrier layer, and this $Al_2O_3$ film is oriented. Therefore, it does not have stiffness, and as shown in FIG. 8A, hydrogen passes through a grain boundary of $Al_2O_3$. In contrast, titanium aluminum oxide ($TiAlO_x$) not oriented is amorphous, and hence, it has stiffness and hydrogen never passes through a titanium aluminum oxide film.

FIG. 9 is a diagram for showing values of remanence of capacitor dielectric films obtained, after annealing, in providing a lower barrier layer and an upper barrier layer of $Al_2O_3$ (as in a conventional device) and values of remanence of capacitor dielectric films obtained, before and after annealing, in providing a lower barrier layer and an upper barrier layer of $TiAlO_x$ (as in Embodiment 2). The results shown in FIG. 9 are obtained through an experiment in which the annealing is carried out in an atmosphere of 100% hydrogen at a temperature of 400° C. for 10 minutes. Also, the lower barrier layer and the upper barrier layer of Embodiment 2 are deposited in a thickness of 40 nm by the sputtering performed under the following conditions:

| | |
|---|---|
| Chamber pressure: | 0.5 Pa |
| Flow rates of argon and oxygen: | 8 ml/min. (standard condition) and 90 ml/min. (standard condition) |
| DC power: | 12 kW |
| Substrate temperature: | 25° C. |
| Grow rate: | 8 nm/min. |
| Time: | 300 sec. |

As is understood from FIG. 9, although the capacitor dielectric film attains a spontaneous polarization value of merely approximately 5 $\mu C/cm^2$ after the annealing in the conventional device, the capacitor dielectric film attains substantially equivalent spontaneous polarization values before and after the annealing and the spontaneous polarization value is approximately 16 $\mu C/cm^2$ in Embodiment 2. It can be understood from these results that hydrogen can be definitely prevented from entering the capacitor dielectric film in Embodiment 2.

(Method for Depositing Film of Metal Oxide not Oriented)

Now, a method for depositing a titanium aluminum oxide film used in each of Embodiments 1 and 2 will be described.

The titanium aluminum oxide film not oriented is deposited through reactive sputtering using a target of TiAl and a mixed gas of an Ar gas and an $O_2$ gas.

Figure 10:
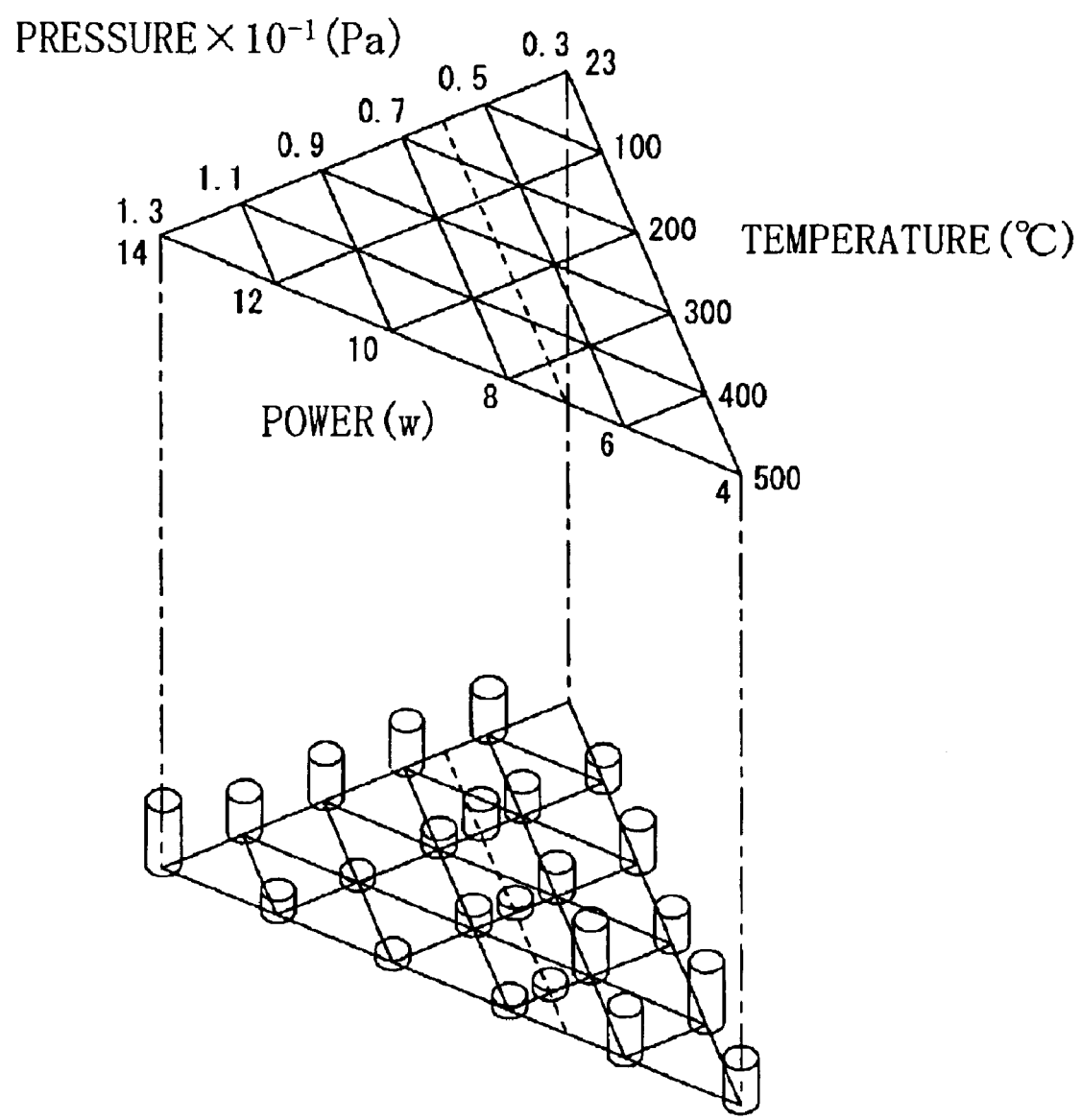
FIG. 10 is a diagram for showing the relationship between parameters employed in depositing a titanium aluminum oxide film and orientation of the resultant film in Embodiment 2.

FIG. 10 shows the relationship between parameters of the sputtering, that is, a temperature, a pressure and DC power, and an X-ray diffraction intensity ratio. In FIG. 10, the height of each column indicates the degree of orientation of the resultant titanium aluminum oxide film.

It is understood from FIG. 10 that the resultant film is changed from a titanium aluminum oxide film not oriented to an oriented titanium aluminum oxide film as the DC power is increased. It is also understood that a titanium aluminum oxide film not oriented can be formed when the DC power is set to 12 kW or less.

Furthermore, when the composition of the gas used for sputtering, namely, the flow rates of the Ar gas and the $O_2$ gas, are controlled to be constant at 8 ml/min. (standard condition) and 90 ml/min. (standard condition), respectively and the chamber pressure is changed, as is understood from the X-ray diffraction intensity ratio, a titanium aluminum oxide film not oriented is formed when the pressure is high, and the resultant film is changed from a titanium aluminum oxide film not oriented to an oriented titanium aluminum oxide film as the pressure is lowered. Moreover, a titanium aluminum oxide film not oriented can be obtained when the pressure is 0.6 Pa or more.

Next, the influence, on the film quality, of the temperature employed in depositing a titanium aluminum oxide film not oriented is studied. On the basis of the X-ray diffraction intensity ratio obtained by changing the substrate temperature employed in the sputtering for forming a titanium aluminum oxide film, it is understood that a titanium aluminum oxide film not oriented can be formed at a temperature ranging between room temperature (23° C.) and a high temperature of 500° C.

Figure 11A:
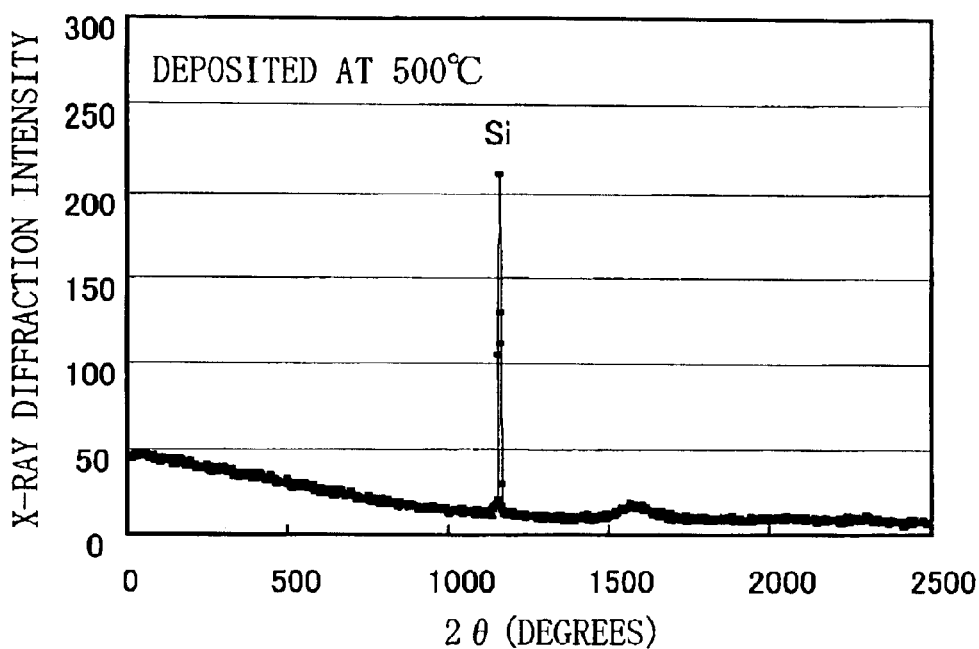
FIG. 11A is a diagram of X-ray diffraction intensity of a titanium aluminum oxide film deposited at a temperature of 500° C.
Figure 11B:
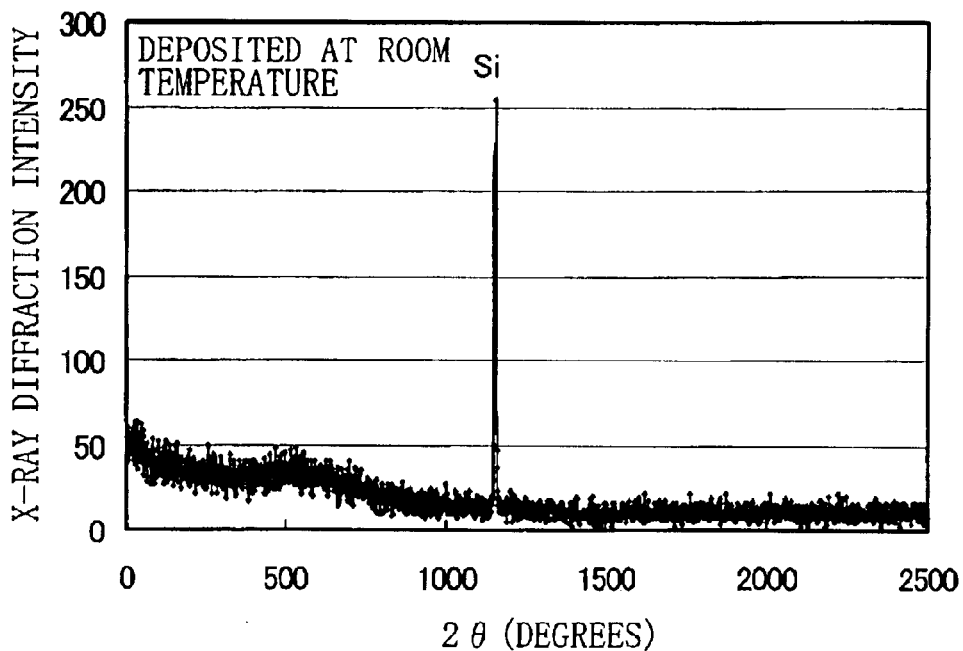
FIG. 11B is a diagram of X-ray diffraction intensity of a titanium aluminum oxide film deposited at room temperature.

FIG. 11A shows the X-ray diffraction intensity of a titanium aluminum oxide film deposited at a temperature of 500° C., and FIG. 11B shows the X-ray diffraction intensity of a titanium aluminum oxide film deposited at room temperature. It is understood from FIGS. 11A and 11B that a titanium aluminum oxide film not oriented can be deposited either at room temperature or at a high temperature of 500° C.

What is claimed is:

1. A semiconductor device comprising:
   an interlayer insulating film formed on a semiconductor substrate on which a transistor has been formed;
   an adhesion layer formed on said interlayer insulating film and made from a metal oxide not oriented;
   a capacitor composed of a lower electrode, a capacitor dielectric film made from a high dielectric constant material or a ferroelectric material and an upper electrode successively formed in this order on said adhesion layer; and
   a conducting plug formed in said interlayer insulating film and said adhesion layer for electrically connecting said transistor and said capacitor to each other.

2. The semiconductor device of claim 1,
   wherein said adhesion layer is amorphous.

3. The semiconductor device of claim 1,
   wherein said metal oxide includes titanium aluminum oxide.

4. The semiconductor device of claim 1, further comprising:
   a conducting barrier layer formed between said adhesion layer and said conducting plug, and said lower electrode,
   wherein said conducting plug connects said transistor and said conducting barrier layer to each other.

5. A semiconductor device comprising:
   an interlayer insulating film formed on a semiconductor substrate on which a transistor has been formed;
   a capacitor composed of a lower electrode, a capacitor dielectric film made from a high dielectric constant material or a ferroelectric material and an upper electrode successively formed in this order on said interlayer insulating film;
   a conducting plug formed in said interlayer insulating film for electrically connecting said transistor and said capacitor to each other; and
   an insulating upper barrier layer formed over said capacitor and made from a metal oxide not oriented.

6. The semiconductor device of claim 5,
   wherein said upper barrier layer is amorphous.

7. The semiconductor device of claim 5,
   wherein said metal oxide of said upper barrier layer includes titanium aluminum oxide.

8. The semiconductor device of claim 5, further comprising an insulating lower barrier layer formed between said interlayer insulating film and said lower electrode and made from a metal oxide not oriented.

9. The semiconductor device of claim 8,
   wherein said lower barrier layer is amorphous.

10. The semiconductor device of claim 8,
    wherein said metal oxide of said lower barrier layer includes titanium aluminum oxide.

11. The semiconductor device of claim 8, further comprising:
    a conducting barrier layer formed between said lower barrier layer and said conducting plug, and said lower electrode,
    wherein said conducting plug connects said transistor and said conducting barrier layer to each other.

12. The semiconductor device of claim 11, further comprising an insulating side barrier layer formed over a side face of said conducting barrier layer and made from a metal oxide not oriented.

13. A method for fabricating a semiconductor device comprising the steps of:

forming an interlayer insulating film on a semiconductor substrate on which a transistor has been formed;

forming an adhesion layer on said interlayer insulating film from a metal oxide not oriented;

forming, in said interlayer insulating film and said adhesion layer, a conducting plug having one end connected to said transistor;

forming, on said adhesion layer, a capacitor electrically connected to the other end of said conducting plug and composed of a lower electrode, a capacitor dielectric film made from a high dielectric constant material or a ferroelectric material and an upper electrode successively disposed in this order on said adhesion layer; and performing annealing in an oxygen atmosphere for crystallizing said capacitor dielectric film.

14. The method for fabricating a semiconductor device of claim 13, wherein said adhesion layer is formed by sputtering carried out at a chamber pressure of 0.6 Pa or more and DC power of 12 kW or less.

15. A method for fabricating a semiconductor device comprising the steps of:

forming an interlayer insulating film on a semiconductor substrate on which a transistor has been formed;

forming, in said interlayer insulating film, a conducting plug having one end connected to said transistor;

forming, on said interlayer insulating film, a capacitor electrically connected to the other end of said conducting plug and composed of a lower electrode, a capacitor dielectric film made from a high dielectric constant material or a ferroelectric material and an upper electrode successively disposed in this order on said interlayer insulating film;

forming an insulating upper barrier layer over said capacitor from a metal oxide not oriented; and performing annealing in a hydrogen atmosphere.

16. The method for fabricating a semiconductor device of claim 15, wherein said upper barrier layer is formed by sputtering carried out at a chamber pressure of 0.6 Pa or more and DC power of 12 kW or less.

17. The method for fabricating a semiconductor device of claim 15, further comprising, between the step of forming an interlayer insulating film and the step of forming a conducting plug, a step of forming an insulating lower barrier layer over a bottom face of said capacitor from a metal oxide not oriented, wherein said conducting plug is formed in said interlayer insulating film and said lower barrier layer in the step of forming a conducting plug.

18. The method for fabricating a semiconductor device of claim 17, wherein said lower barrier layer is formed by sputtering carried out at a chamber pressure of 0.6 Pa or more and DC power of 12 kW or less.

19. The method for fabricating a semiconductor device of claim 17, further comprising, between the step of forming a conducting plug and the step of forming a capacitor, a step of forming a conducting barrier layer on said lower barrier layer and said conducting plug.

20. The method for fabricating a semiconductor device of claim 19, wherein the step of forming a capacitor includes a sub-step of forming an insulating side barrier layer over a side face of said conducting barrier layer from a metal oxide not oriented.

* * * * *